(12) United States Patent
Bugge

(10) Patent No.: US 7,759,672 B2
(45) Date of Patent: Jul. 20, 2010

(54) OPTICAL DEVICES USING A PENTERNARY III-V MATERIAL SYSTEM

(75) Inventor: Renato Bugge, Trondheim (NO)

(73) Assignee: Integrated Optoelectronics AS, Trondheim (NO)

( * ) Notice: Subject to any disclaimer, the term of this patent is extended or adjusted under 35 U.S.C. 154(b) by 209 days.

(21) Appl. No.: 11/909,277

(22) PCT Filed: Mar. 30, 2006

(86) PCT No.: PCT/NO2006/000118

§ 371 (c)(1),
(2), (4) Date: Sep. 21, 2007

(87) PCT Pub. No.: WO2006/104392

PCT Pub. Date: Oct. 5, 2006

(65) Prior Publication Data

US 2009/0090902 A1 Apr. 9, 2009

(30) Foreign Application Priority Data

Mar. 30, 2005 (NO) .................................. 20051589

(51) Int. Cl.
*H01L 33/00* (2010.01)
*H01L 29/08* (2006.01)
*H01L 21/00* (2006.01)

(52) U.S. Cl. .................... 257/14; 257/22; 257/E21.002; 257/E21.085; 257/E33.008; 257/E33.023

(58) Field of Classification Search .................... 257/14, 257/E21.002, E29.072, 22, E21.085, E33.008, 257/E33.023; 438/31
See application file for complete search history.

(56) References Cited

U.S. PATENT DOCUMENTS

| | | | | |
|---|---|---|---|---|
| 5,580,818 A | * | 12/1996 | Sakata | 438/35 |
| 5,625,635 A | * | 4/1997 | Kurtz et al. | 372/45.011 |
| 5,689,123 A | * | 11/1997 | Major et al. | 257/190 |
| 6,233,264 B1 | * | 5/2001 | Sato | 372/45.01 |
| 2002/0051615 A1 | * | 5/2002 | Walpole et al. | 385/131 |
| 2004/0136428 A1 | * | 7/2004 | Miyachi et al. | 372/50 |
| 2004/0248334 A1 | * | 12/2004 | Hoss et al. | 438/39 |

OTHER PUBLICATIONS

Flatte Michael E et al: "III-V interband 5.2 um laser operating at 185 K" Applied Physics Letters, AIP, American Institute of Physics, Melville, NY, US, vol. 71, No. 26, Dec. 29, 1997, pp. 3764-3766.*

* cited by examiner

*Primary Examiner*—Zandra Smith
*Assistant Examiner*—Jeremy J Joy
(74) *Attorney, Agent, or Firm*—Dennison, Schultz & MacDonald

(57) ABSTRACT

The invention relates to the design and processing of a semiconductor optical device. The device is formed of at least four layers of III-V compounds in which one consists of the penternary AlGaInAsSb material. The structure is wet etched in order to form optical ridge waveguides. One such device has incorporated two waveguides which are connected through a new junction design which can be made by wet etching. In one design the junction and waveguides consists of wet etched AlO.90GaO.10AsSb cladding around a core of AlO.28GaO.72AsSb in which an active layer composed of AlO.22InO.22GaO.55AsSb/InO.29GaO.71AsSb quantum wells is embedded. The resulting device is a erdge junction laser which has single mode emission and emits a narrow line width. We made and tested a device in the 2.34 müm to 2.375 müm wavelength area and found it to have an emission line width of around 0.5 nm.

8 Claims, 15 Drawing Sheets a. Traditional Y-junction design.    b. New Ψ-Junction design.

Schematics of Y- and Ψ-Junction designs showing the difference of such. The Ψ-Junction has opposite bending (R₂) and prolonged waveguides in junction area to reduce loss from the U-shaped feature that results from isotropic etching.

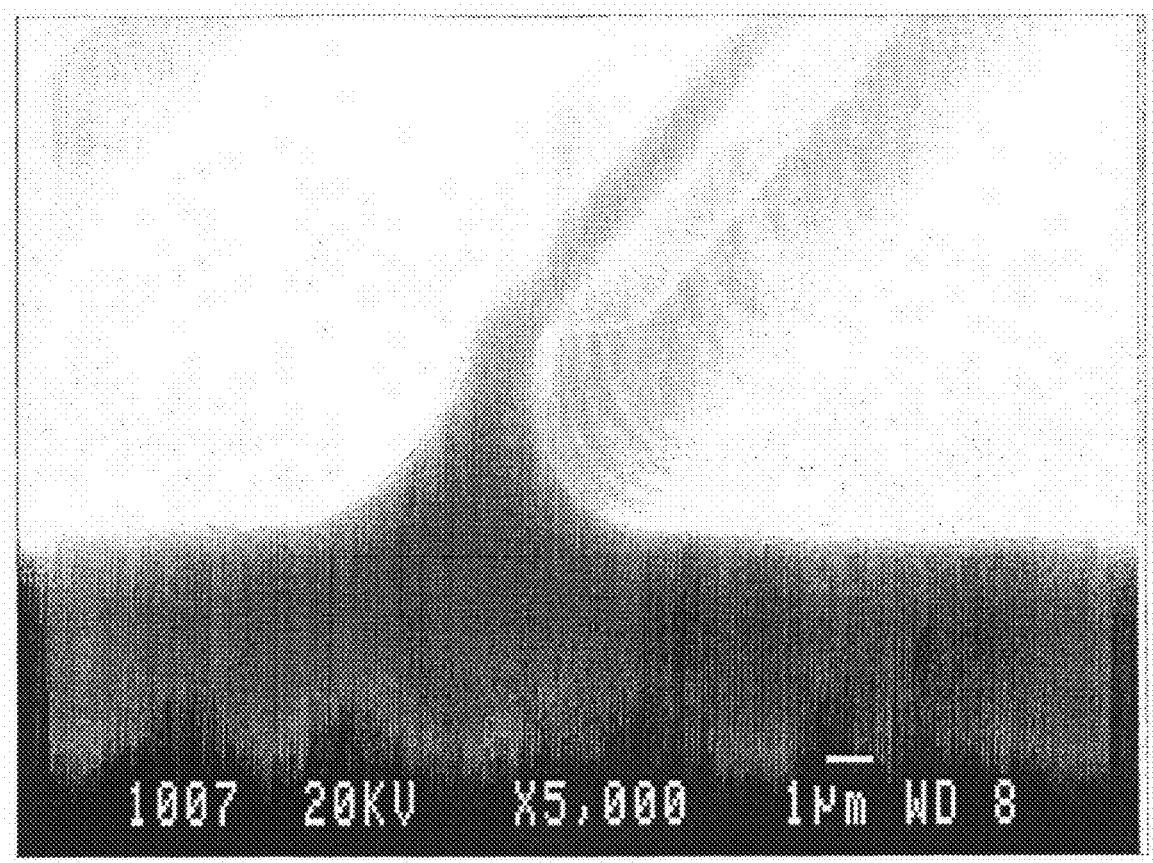
Figure 1. Scanning electron microscopy picture of a thin photoresist masking layer on top of a semiconductor ridge waveguide. Some etching beneath the masking layer can be seen at the edges.

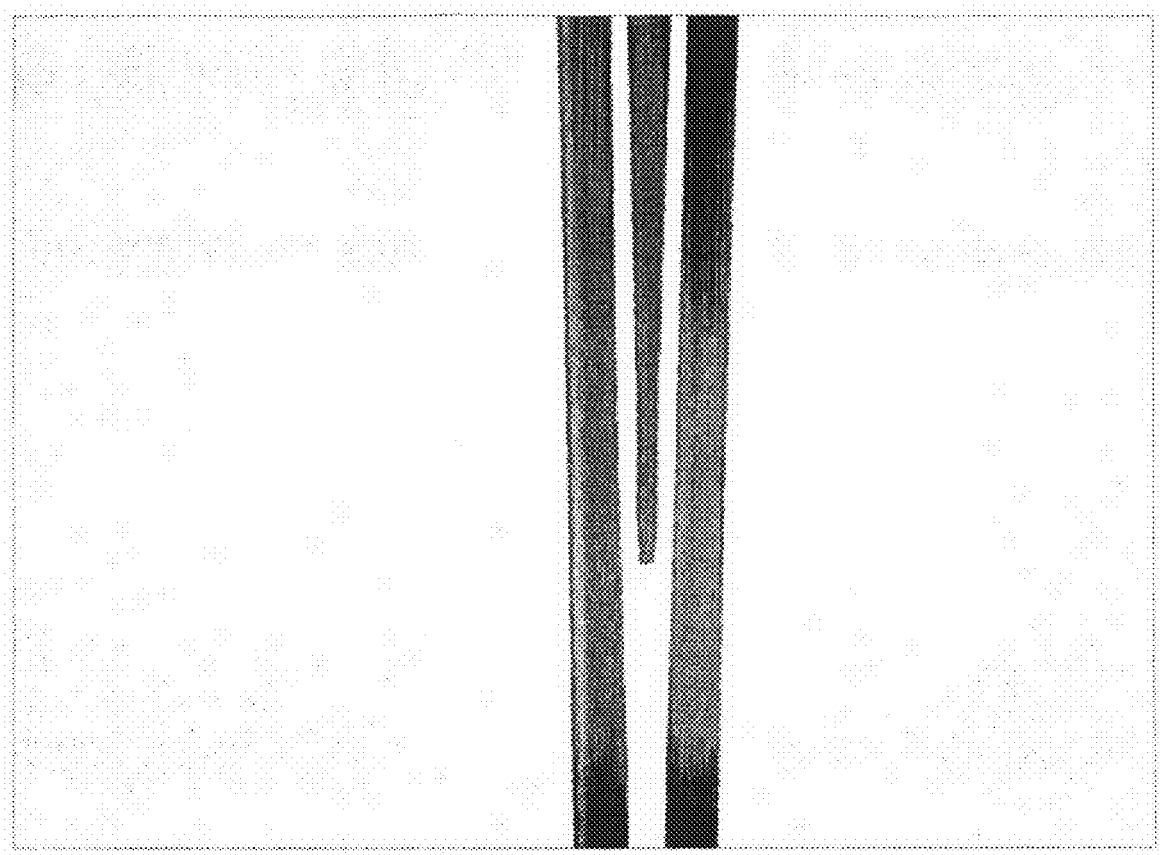
Figure 2. Optical Nomarski microscope picture of a wet etched Ψ-Junction ridge (500X). The dark area shows were the cladding has been etched away, revealing the U-shaped feature of the inner part of the junction.

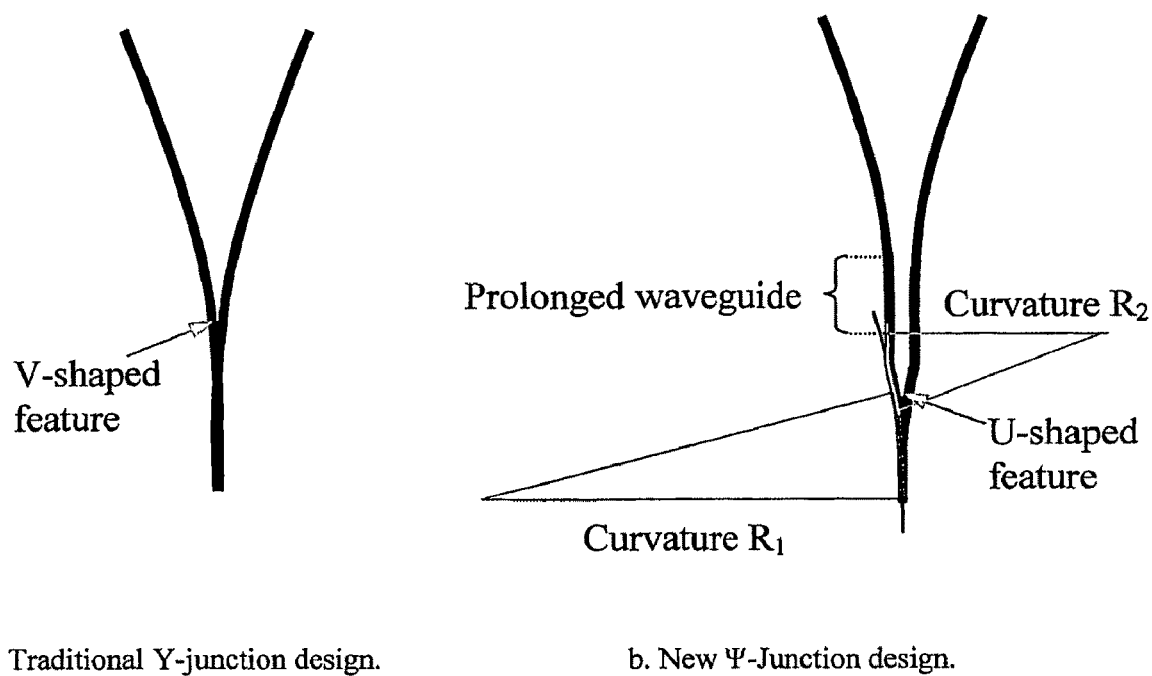
a. Traditional Y-junction design.   b. New Ψ-Junction design.
Figure 3. Schematics of Y- and Ψ-Junction designs showing the difference of such. The Ψ-Junction has opposite bending ($R_2$) and prolonged waveguides in junction area to reduce loss from the U-shaped feature that results from isotropic etching.

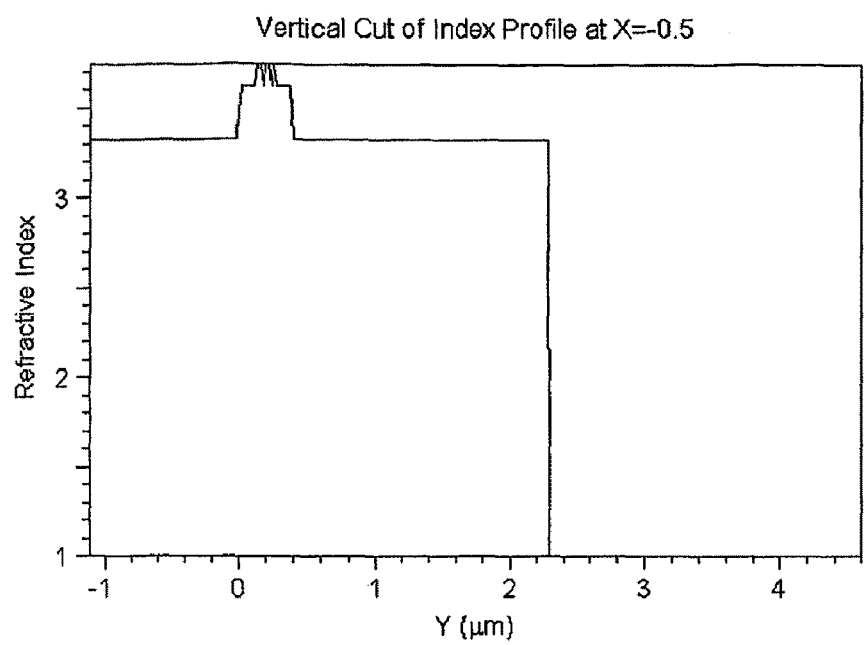
Figure 4. Refractive index profile and of simulated structure. Wafer surface is at Y=2.3um, waveguide core from Y=0 to Y=0.4um (Vertical direction).

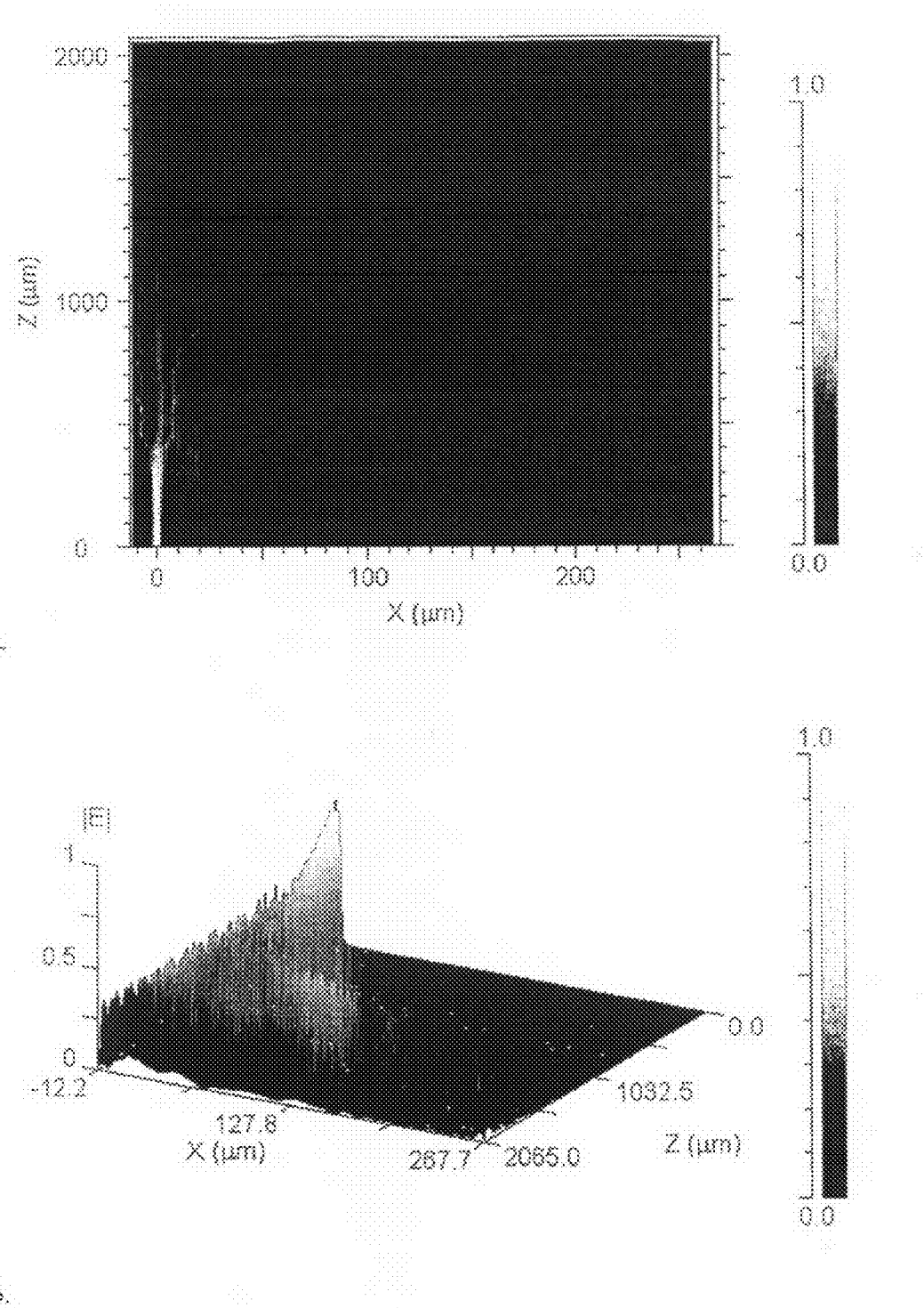
Figure 5. Plot of electrical field in simulated splitting of optical beam by symmetric Y-Junction ridge. Gaussian optical beam enters at X=Z=0um and is propagated into the U-juction and further into two arms (after Z=600um), one S-bending waveguide and one straight waveguide.

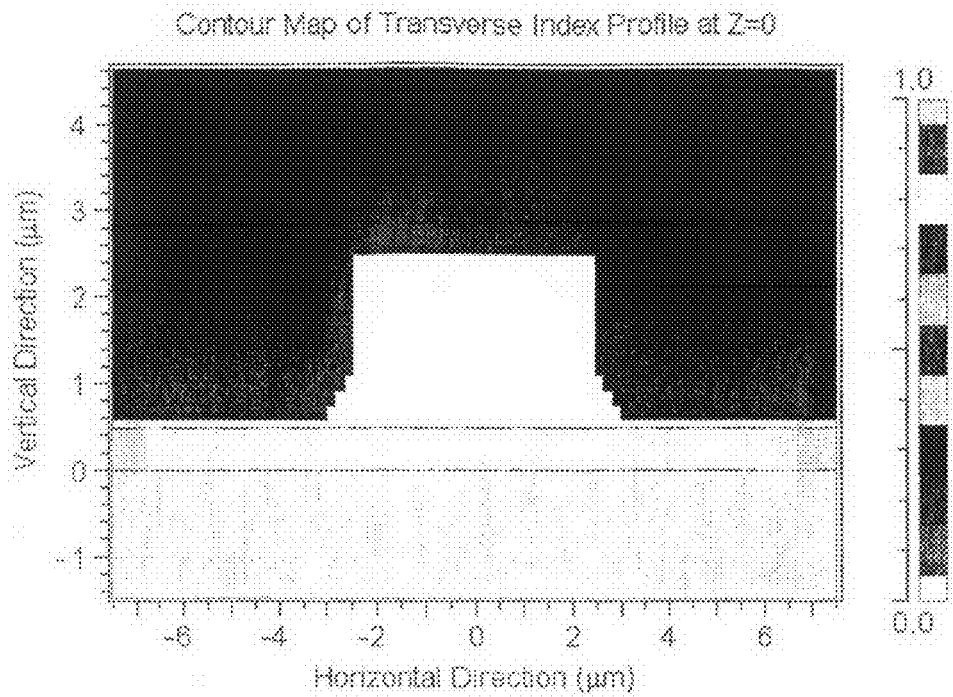

Figure 6. Index cross-section showing ridge profile from model of wet-etch ridge. Bottom of the ridge is 6μm wide, while the top is 5μm due to the under etch feature during wet etching.

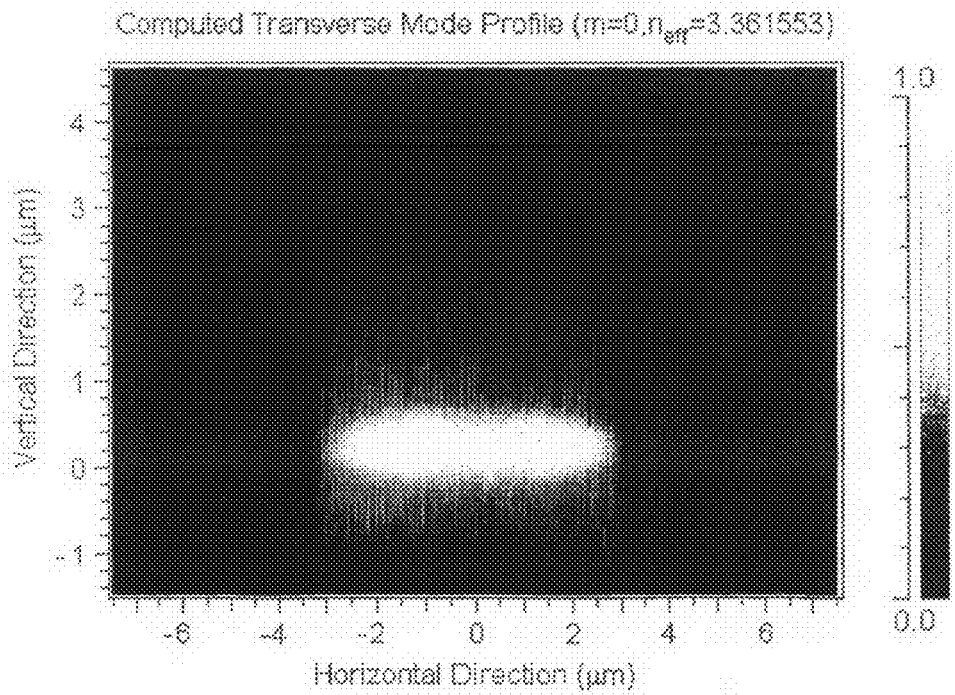

Figure 7. Figure shows transverse fundamental mode of the wet-etch type ridge in figure 6 (5μm top). The figure shows that this ridge profile exhibits little field loss (although it can support several transverse modes).

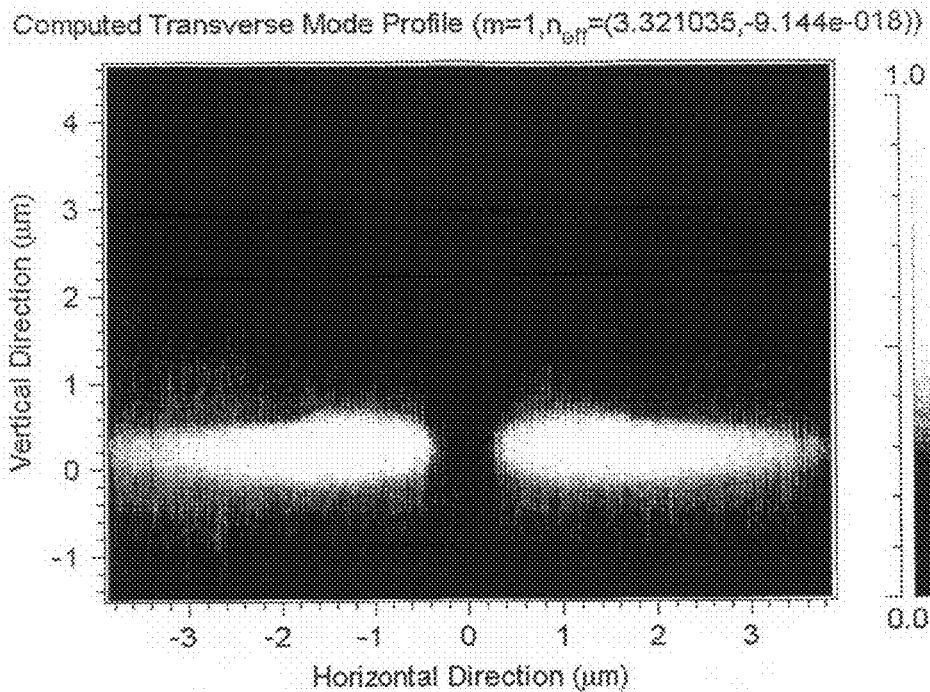

Figure 8. Transverse mode profile (m=1) of wet-etch type ridge as shown in figure 6, but with 3.5μm wide ridge top. Beam propagation shows that this structure can only support a second mode in addition to the first transverse mode (m=0).

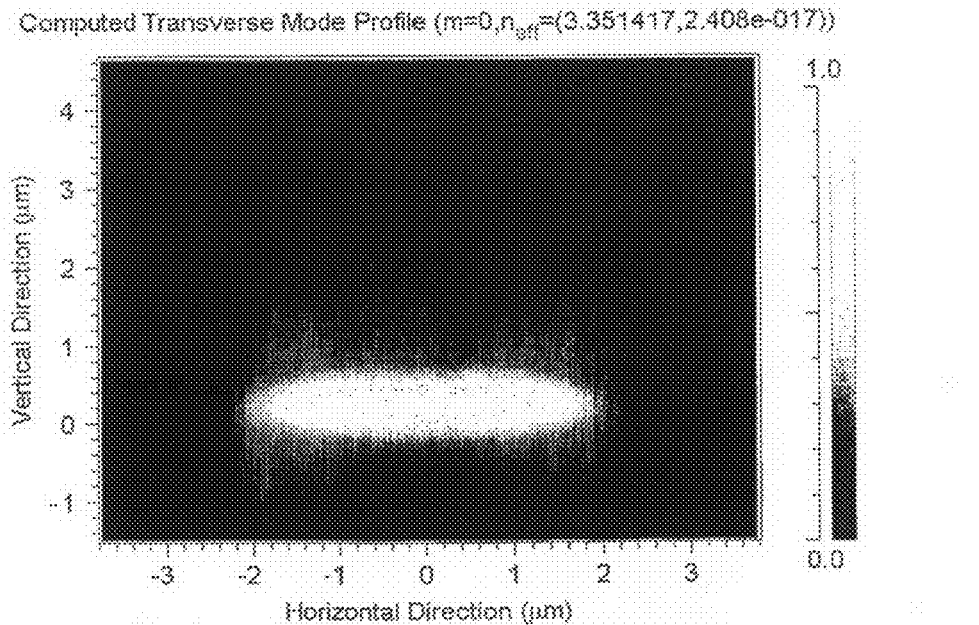

Figure 9. Transverse mode profile (m=0) of wet-etch type ridge as shown in figure 6, but with 3.3μm wide ridge top. Beam propagation shows that such structures with 3.2μm-3.4μm wide ridge tops cannot support a second mode, meaning single mode propagation.

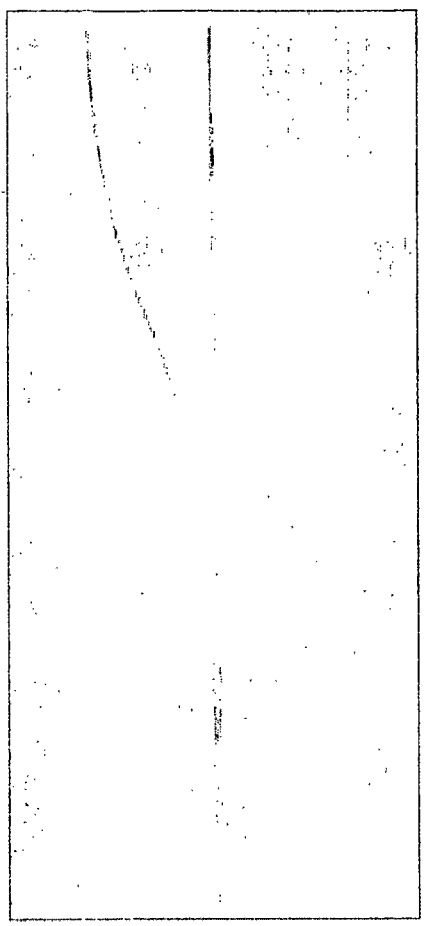
Figure 10. Optical microscopy picture of a Ψ-Junction laser structure. The picture shows the metal contacts with pads (yellow), waveguides (black) and spin-on glass (orange). The waveguides were etched prior to applying spin-on glass dielectric and metal contacts on top.

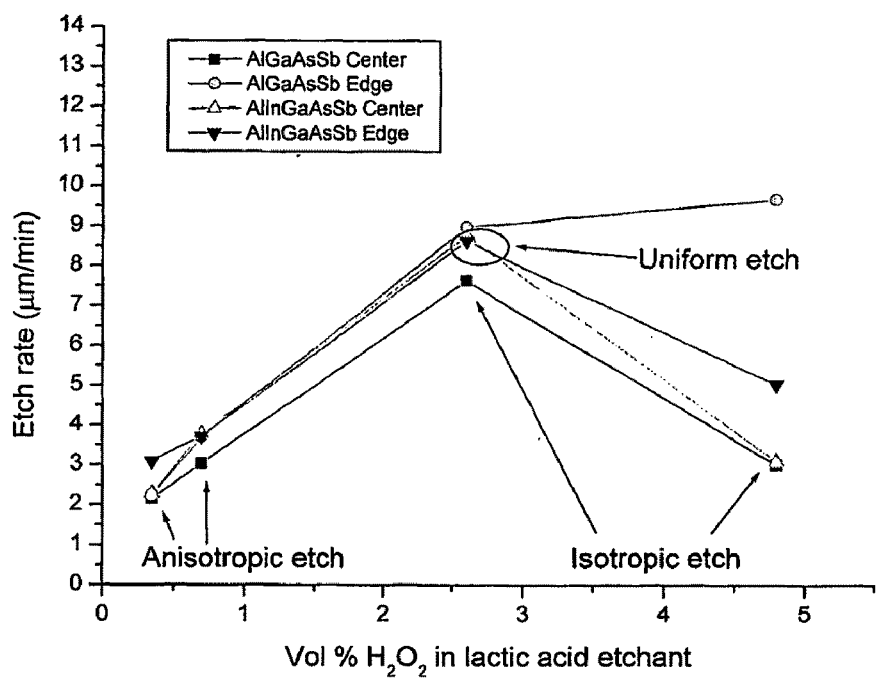
Figure 11. Etch rates of $Al_{0.90}Ga_{0.10}AsSb$ and $Al_{0.82}Ga_{0.10}In_{0.08}AsSb$ which suggests increased etch uniformity from a lactic acid based etchant when adding In to $Al_{0.90}Ga_{0.10}AsSb$ (lattice matched to GaSb).

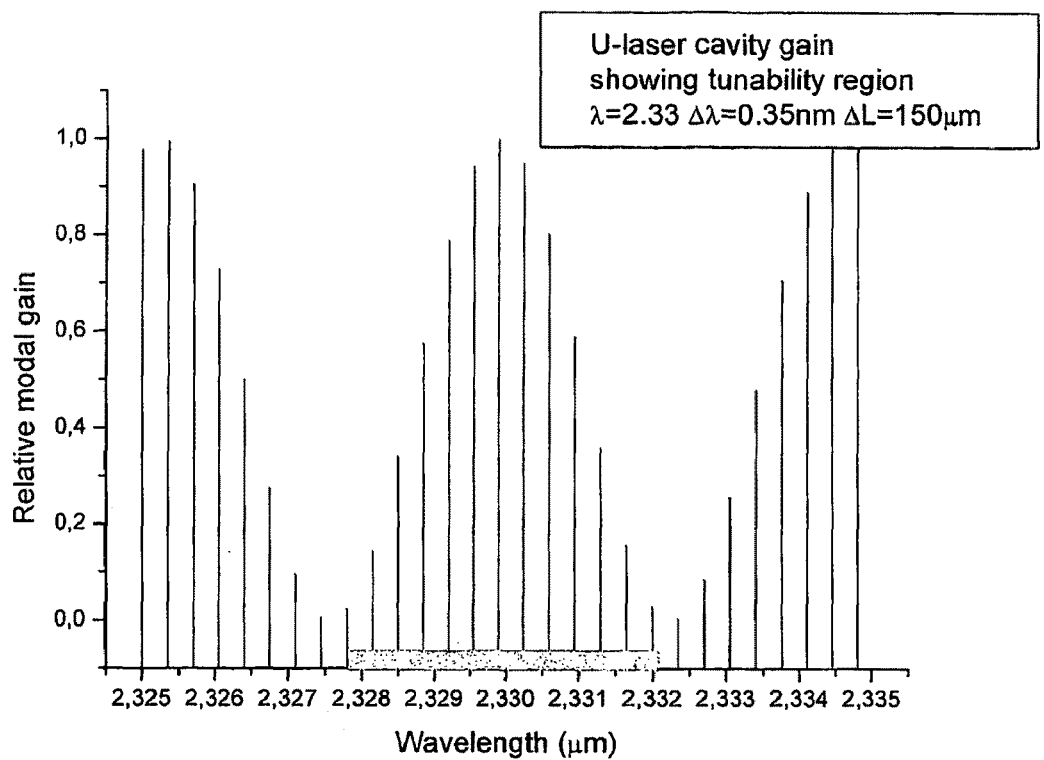
Figure 12. Modal gain of an Ψ-Junction laser (as in figure 10) with ~150μm difference in arm length. The device shows a tuneablility of 4nm around the 2330nm central wavelength.

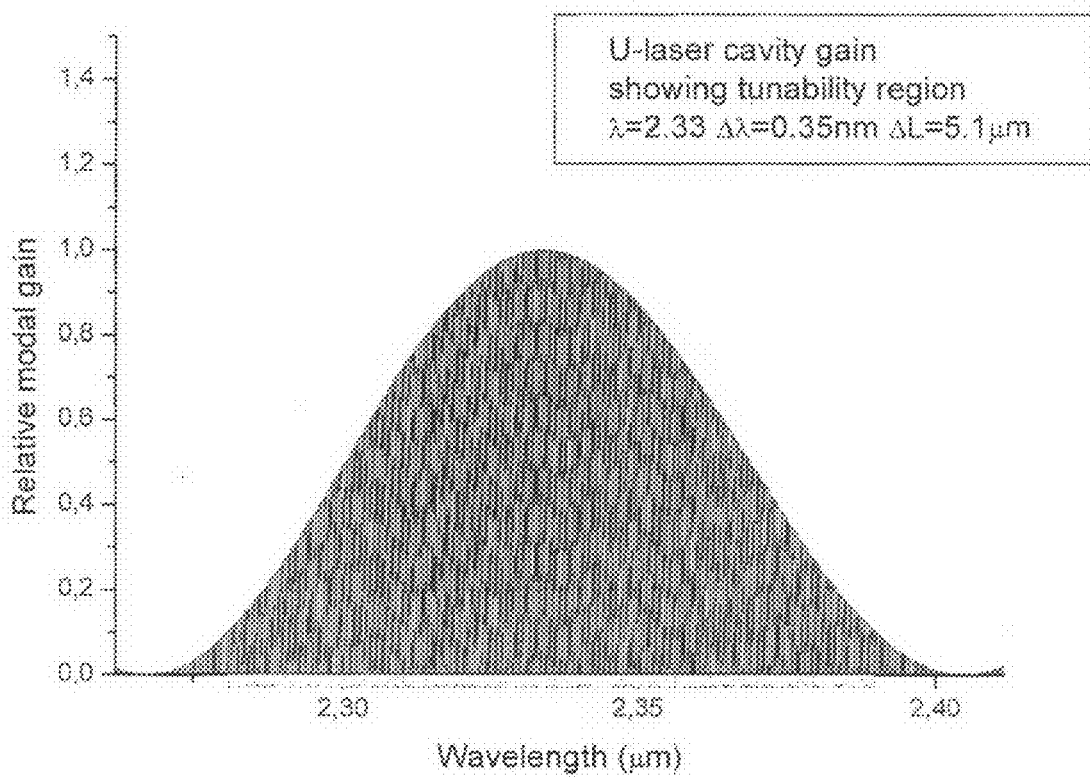
Figure 13. Modal gain curve of an Ψ-Junction laser with only ~5μm difference in arm length. The device shows a potential tuneablility of over 100nm around the 2330nm central wavelength for such a device.

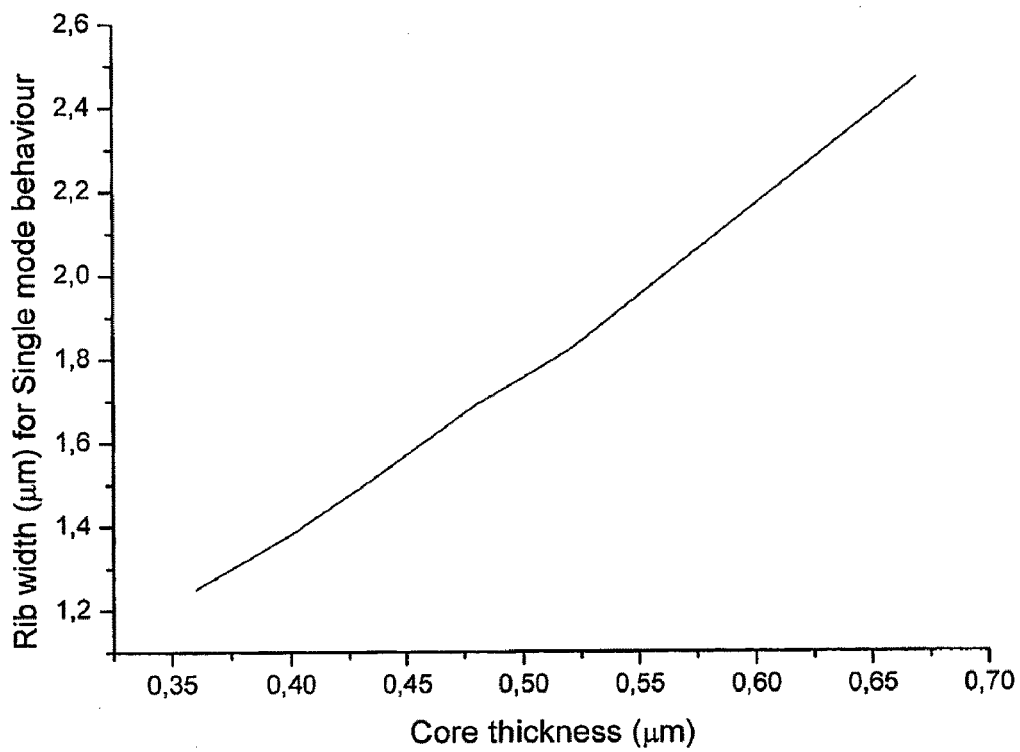
Figure 14. Curve shows maximum waveguide ridge width for Single Mode behaviour, as a function of core thickness, in an AlGaInAsSb ridge. The width was calculated using the effective index method with cladding above the core (the ridge) and no cladding at the sides of the ridge (RI=1.4). Refractive index of core was 3.62 and 3.30 for ridge and cladding.

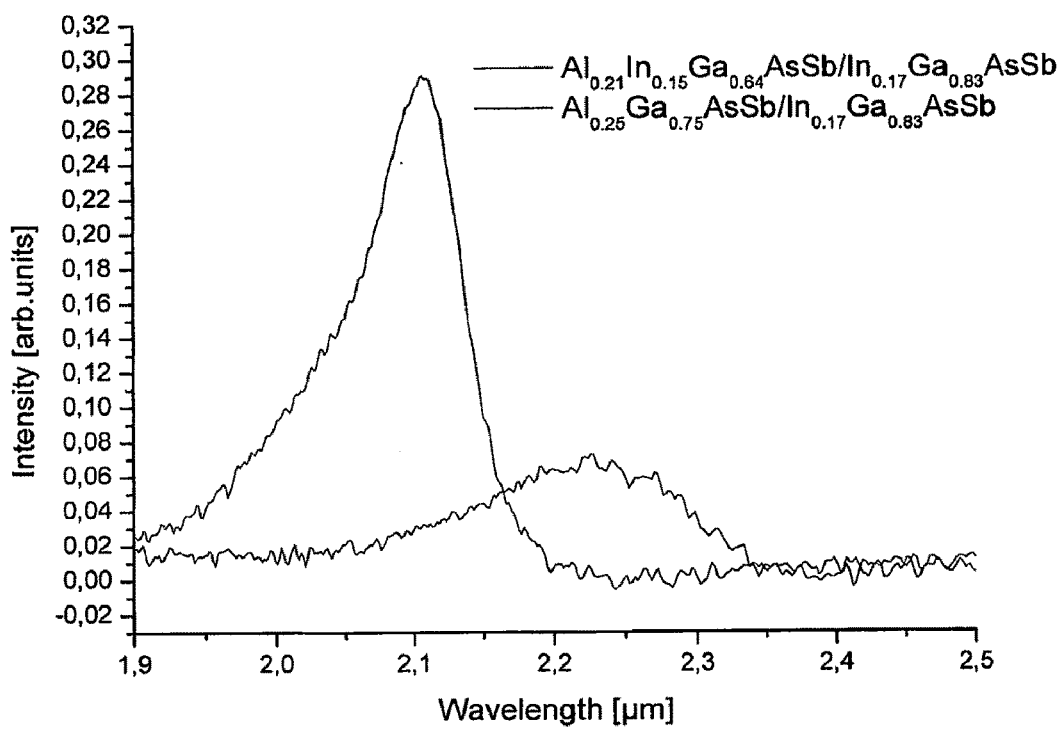
Figure 15. Photoluminescence spectra at RT from $Ga_{0.83}In_{0.17}As_ySb_{1-y}$ quantum wells with $Al_{0.21}In_{0.15}Ga_{0.64}As_ySb_{1-y}$ or $Al_{0.21}In_{0.15}Ga_{0.64}As_ySb_{1-y}$ barriers, nearly lattice matched to GaSb. Growth fluxes were kept at 0.75ML/s for Ga, 0.25ML/s for Al and 0.15ML/s In for both samples. Using In in the barrier can be seen to increase the wavelength

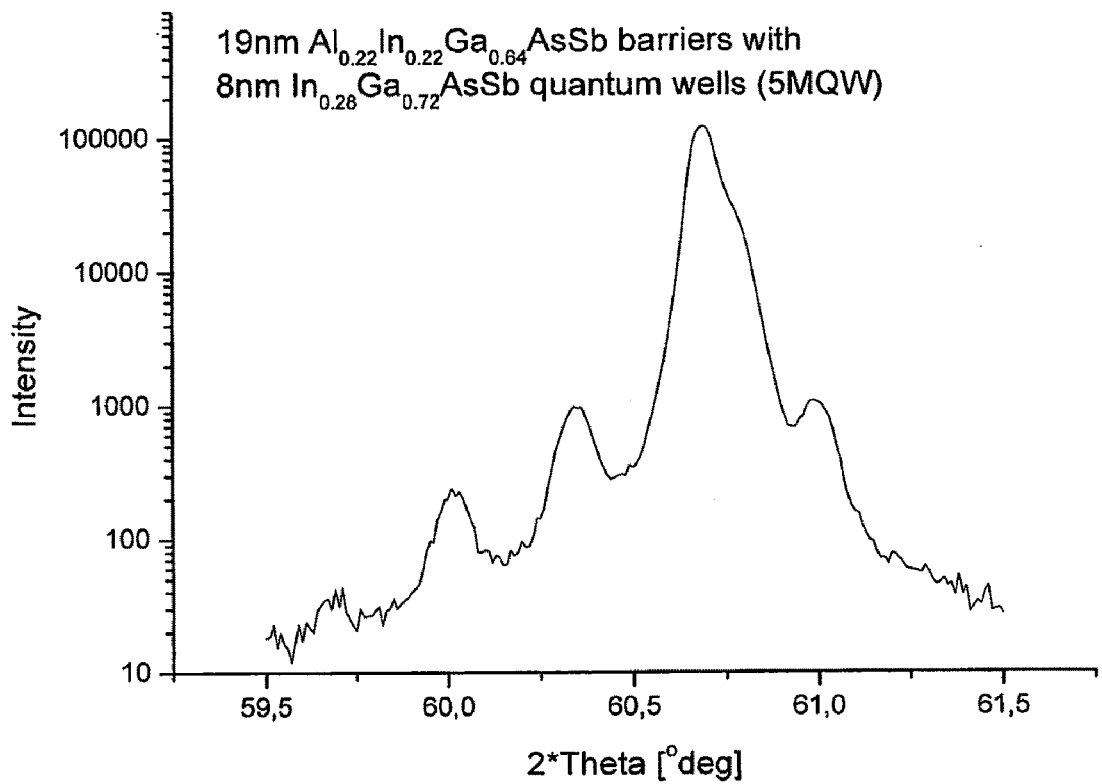
Figure 16. A [004] x-ray diffraction spectrum from a sample with $Ga_{0.72}In_{0.28}As_ySb_{1-y}$ quantum wells and $Al_{0.22}Ga_{0.56}In_{0.22}As_ySb_{1-y}$ barriers, lattice matched to GaSb at room temperature. The spectrum shows a superlattice period of 27nm

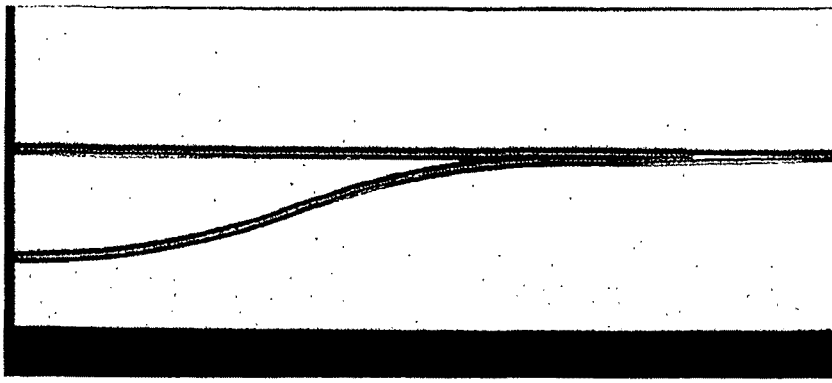

Figure 17. Picture of Ψ-Junction ridge laser structure after spin etching. The thin ~4μm wide ridge waveguide can be seen inside larger contact/support areas which are electrically isolated.

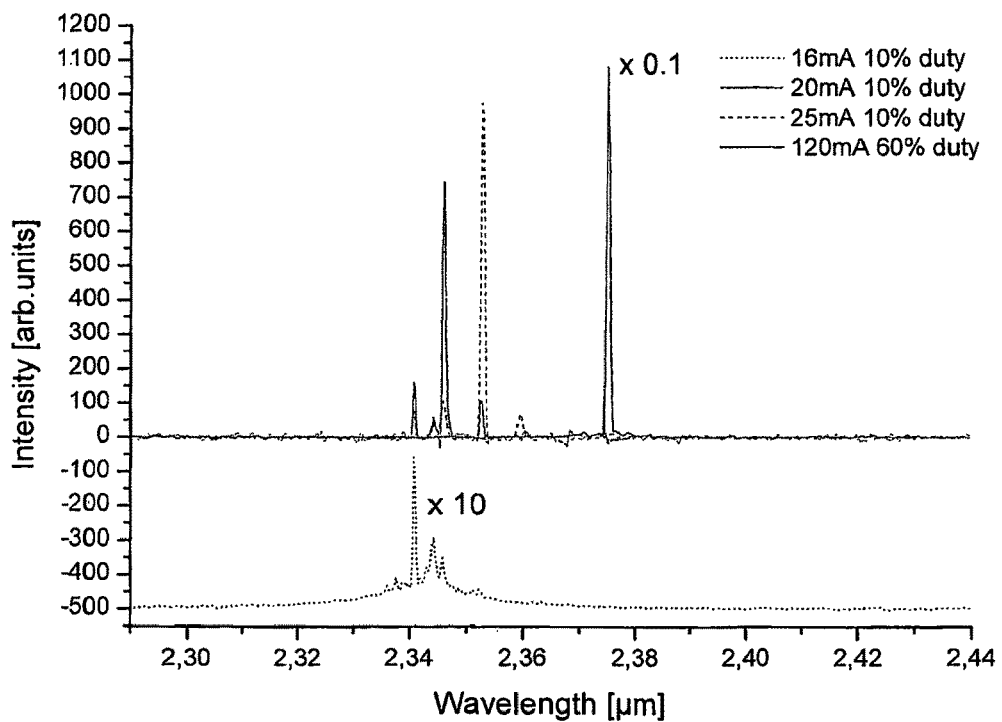

Figure 18. Emission spectrum from a $Al_{0.22}In_{0.22}Ga_{0.55}AsSb/In_{0.29}Ga_{0.71}AsSb$ MQW wet etched junction ridge laser (p-side down). For a current of 16mA with 10% duty cycle pulses (160mA current in pulse), the laser is around threshold. At 20mA and 25mA, three of four modes can be seen to lase, while at 120mA with 60% duty cycle pulses only one strong mode at 2375nm can be seen.

OPTICAL DEVICES USING A PENTERNARY III-V MATERIAL SYSTEM

FIELD OF THE INVENTION

The present invention relates to the design and processing of a semiconductor optical device formed of at least three layers of III-V compounds of AlGaInAsSb, AlGaAsSb and/or InGaAsSb, in which at least one of the layers consists of the penternary AlGaInAsSb material. Two of the layers can form a cladding around a core in which light is optically guided, while the core can contain several layers of which multiple quantum wells can be embedded. The multiple quantum well (MQW) can be part of an active region if the device is a semiconductor laser, a semiconductor optical amplifier, an electron absorption modulator, an optical junction modulator or alike device. The semiconductor devices have metal connections that are connected to the semiconductor material in some parts, preferably Ti/Pt/Au to p-type or Pd/Pt/Au to n-type. In non-connected areas, the metal can be insulated from the semiconductor with a layer of insulating material, preferably Spin-on Glass. The metal can form contact pads for electrical wiring to an external power supply.

A new type of optical ridge waveguide with sloped sides, is formed by wet etching the upper cladding. These new ridge waveguides support single mode guiding with broader ridge width than for conventional square ridge waveguides.

A Ψ-Junction semiconductor laser consists of one or more Ψ-Junctions that are etched into the upper cladding in the device. The Ψ-Junction is a new junction design that enables optical junctions to be made by wet etching. The Ψ-Junction(s) are connected to two or more optical ridge waveguides in the device. The optical waveguides are embedded in an optical cavity in which light is reflected back and forth to obtain lasing. The ends of the optical waveguides and/or junctions can be coated to reduce or increase reflection. A laser structure with layers of (doped) AlGaInAsSb as cladding is preferable to obtain uniform wet etching of the ridges and junction. The laser contains an MQW active layer of AlGaAsSb or AlInGaAsSb barriers and compressively strained InGaAsSb wells, embedded in an AlGaAsSb or AlInGaAsSb core to obtain good optical gain and guiding. With two or more optical waveguides, the device can be tuned to different wavelengths by individually changing the injection current into the different optical waveguides. The area of which the wavelength can be tuned is dependent on the layer thickness, material composition and strain in the MQW layers.

An optical junction modulator consists of two optical waveguides that are connected in two junctions with the new Ψ-Junction design. Before splitting and after coupling of the light in the junction, a single waveguide can start and end the device. The waveguide or junction ends can be coated to obtain lower or higher reflection in or out of the device.

Other devices can be optical waveguide(s), an optical coupler/decoupler, an arrayed waveguide grating or alike. These devices can be passive or active devices, with or without an active region. For both active and passive devices, metal contacts can be used to heat parts or whole of the devices to trim parameters as refractive index, mechanical stress and alike that affect the optical performance of the device. For active devices, the device obtain optical gain in parts or whole of the device by electrical injection into the active area and/or layers.

BACKGROUND OF THE INVENTION

In order to make integrated optical devices as semiconductor micro lasers, one has to be able to guide the light through the device. This can be accomplished by making optical waveguides in the device, as ridge waveguides or alike. For a junction laser, such a ridge can be straight, bended and/or with junctions. For junction lasers such as a Y-junction, the device performance of the laser is dependent on the resolution at which the junction can be etched. Improved resolution means a more V-like shape of the inner part and better power transmission as the junction becomes a true Y-junction (P. Sewell et al. (1997)). This has traditionally been carried out by dry etching techniques as reactive ion etching (RIE) (K. Al Hemyari et al. (1993)). The RIE process can result in an isotropic etch in which the surface is etched normal to the surface plane, and sidewalls of the ridge features are straight.

GaSb-based materials as AlGaAsSb and InGaAsSb has previously been used to make lasers (Choi et al. (1991), Simanowski et al. (2001), Yarekham et al. (2000)). These lasers have all been high-power multimode lasers with applications as remote sensing and alike. This is not good enough for all electro optical microsystems in which optical single mode operation is sometimes required.

A wet etching process had been previously developed (R. Bugge et al. (2002)) which could etch AlGaInAsSb materials with good control and anisotropic features. For the patterning in the present invention, this etchant was used to make the new structures.

A new process for increasing the doping concentration of Te-doped material has been previously submitted in a separate patent (R. Bugge (2004)).

A new penternary semiconductor structure based on three or more layers of AlInGaAsSb is proposed for making single mode optical components. The structure can be used for both active or passive components and specifically mid-IR lasers. By using AlInGaAsSb material in the cladding and spin-etch processing, good etch-control has been achieved. Accurate ridge waveguides has been fabricated with this wet etch method. The ridge waveguides gives single mode operation when designed and made with predetermined refractive indexes in core and claddings. To compensate for refractive index changes in cladding when increasing In-content, AlInGaAsSb material can also be used in the core.

For active devices, a MQW active region of AlGaAsSb or AlInGaAsSb barriers and InGaAsSb or AlInGaAsSb wells, was embedded in the core. In was used in the barriers for prevention of band edge bending between the core and barrier (when the core contained In). The addition of small amounts of Al to the InGaAsSb wells will increase the band gap of the well. Due to In-diffusion, the MBE growth temperature of the substrate has to be kept below 490 C once InGaAsSb material has been grown on it, as compared to 550 C for AlGaAsSb. During sequential growth of AlGaAsSb or AlInGaAsSb on top of the AlInGaAsSb, a higher growth temperature than the 490 C limit (for InGaAsSb) can be used due to smaller net In-diffusion between the wells and barrier. Another advantage with this structure is that Rapid Thermal Annealing (RTA) can later be carried out on the structure without any significant In-seggregation (In-diffusion from the wells into the barriers).

In order to make junction lasers and other optical junction devices with wet etching, the device design has to be altered from the traditional junction design. In wet etching, the V-shape of a Y-junction will end up as an U-like shape after processing due to the anisotropy of the etch. For a Y-junction designed device, this would result in a non-working device, but using the design rules for a device in the present invention, a working junction based device can be made.

To make a ridge on a wafer, one has to apply a masking material to the surface of the wafer. After processing, the masking material will define the pattern of the ridge. During sequent processing of the wafer, a wet chemical etchant will etch the material which is not masked by the masking material. Due to the anisotropy of the wet etching (used here), the etching will result in some etch beneath the masking material at its edges (underetch), as shown in FIG. 1. In this figure we see a ridge of the semiconductor material with photoresist masking at its top. During sequential processing, the photoresist will be removed and the result is a free-standing ridge. This underetch had to be taken into consideration when we designed the ridge, as it results in a U-like feature at the inner part of the junction as shown in FIG. 2. Such a U-like feature will result in loss of light in a traditional Y-junction ridge structure.

The idea of the present invention was to incorporate bends in the opposite direction of the junction bends to prolong the waveguide in the junction area and collect any light which is lost in the U-shaped feature of the Ψ-Junction (see FIG. 3). The U-shaped feature is a result of the isotropic wet etching, so that reducing the importance of this feature was important to make useable wet etched junctions.

During design, the optical waveguiding properties of the Ψ-Junction based device had to be simulated in order to test the junction prior to making it. Using the beam propagation method (BPM), we simulated ridge waveguide junctions. FIG. 5 shows the propagated optical field in one of our Ψ-Junction designs. Some splitting loss can be seen, although most of the field remains in the waveguides.

Optical coupling of the devices in the current invention, is done by coupling the waveguide ends to other wave guiding devices through optical fibers, embedded waveguides, planar waveguides, ridge waveguides, tenses and alike. By using coatings of higher or lower reflection, or designs that adjust the optical field at the waveguide ends of the device, coupling loss can be reduced.

SUMMARY OF THE INVENTION

In one aspect the present invention relates to a semiconductor device comprising:
a) At least three layers of semiconductor material of $Al_{1-x-z}Ga_xIn_zAs_{1-y}Sb_y$ with $0<x<1$, $0<y<1$, $0\leq z<1$ and $0<x+z\leq 1$, on top of a substrate material, of which at least one layer with $0<z<1$ and $0<x+z<1$.
b) Etched structure(s) in the semiconductor material for defining optical waveguides and/or electrical connections through the device.
c) Electrical insulating layer(s) or parts for insulating parts of the device and/or to define contacts and/or conduction wires in/on the device
d) Metal layer(s) or parts for defining contacts and/or conduction wires in/on the device In a further aspect, the present invention relates to making a semiconductor device wherein some or all of the semiconductor layers compromise two cladding layers around a core of one or more layers.

In another embodiment, the present invention relates to making a semiconductor device in which the cladding layers consist of $Al_{1-x-z}Ga_xIn_zAs_{1-y}Sb_y$ with $0<x<0.6$, $0<y<1$, $0\leq z<0.5$ and $0<x+z<0.6$ In another embodiment, the present invention relates to making a semiconductor device, wherein the cladding layers are uniformly or gradually doped with Tellurium or Beryllium or other dopant.

In another embodiment, the present invention relates to making a semiconductor device, wherein the core is made of two layers of semiconductor material around an active region of semiconductor material.

In a further embodiment, the present invention relates to making a semiconductor device in which the two core layers around the active region, consist of $Al_{1-x-x}Ga_xIn_zAs_{1-y}Sb_y$ with $0.4<x<1$, $0<y<1$, $0\leq z<0.5$ and $0.4<x+z<1$, undoped, gradually doped or uniformly doped.

In a further embodiment, the present invention relates to making a semiconductor device, wherein the active region of semiconductor material is made of several layers, making it into multiple quantum wells of at least two semiconductor materials.

In a further embodiment, the present invention relates to making a semiconductor device in which the two semiconductor materials of the multiple quantum wells consist of barrier layers of $Al_{1-x-z}Ga_xIn_zAs_{1-y}Sb_y$ with $0.4<x<1$, $0<y<1$, $0\leq z<0.5$ and $0.4<x+z<1$ and well layers of $Al_{1-x-z}Ga_xIn_zAs_{1-y}Sb_y$ with $0<x<1$, $0<y<1$, $0<z<1$ and $0.9-x+z\leq 1.00$.

In another embodiment, the present invention relates to making a semiconductor device wherein semiconductor contact layers exists around or in electrical connection with the cladding layers.

In a further embodiment, the present invention relates to making a semiconductor device wherein the semiconductor contact layers are GaSb, InSb, GaAs, InAs, GaInAs, GaInSb, InAsSb, GaAsSb or GaInAsSb, undoped or doped with Silisium, Tellurium, Beryllium or alike p-type or n-type dopant.

In a fiber embodiment, the present invention relates to making a semiconductor device in which the substrate is one of the semiconductor contact layers.

In a further embodiment, the present invention relates to making a semiconductor device in which the device is a Laser, a Optical Amplifier, an Electron Absorption Modulator or other Optical Device.

In another aspect, the present invention relates to making a semiconductor device wherein layer(s) have been etched in order to define one or more optical waveguides.

In a further embodiment, the present invention relates to making a semiconductor device wherein wet etching is used in order to define the optical waveguide(s).

In an even further embodiment, the present invention relates to making a semiconductor device wherein the optical waveguide is a ridge optical waveguide.

In a further embodiment, the present invention relates to making a semiconductor device, in which the device is a Laser, a Optical Amplifier, an Electron Absorption Modulator, a Junction Optical Modulator, an Arrayed Waveguide Grating or other device with optical waveguides.

In an even further embodiment, the present invention relates to making a semiconductor device wherein one ridge optical waveguide is connected to at least two ridge optical waveguides in a waveguide junction.

In an even further embodiment, the present invention relates to making a semiconductor device wherein the waveguide junction consists of at least one input waveguide extending into at least two output waveguides so that the optical wave is guided from the input waveguide and divided into the output waveguides, and/or vice versa.

In an even further embodiment, the present invention relates to making a semiconductor device wherein a groove/the space between two output optical waveguides is designed so that is has an U-like groove end at the point the optical input waveguide(s) ends and the output waveguides start.

In a further embodiment, the present invention relates to making a semiconductor device wherein there is at least two elements in the waveguide design around an input waveguide, with bending from an initial angle to the output waveguides into a parallel, so that the optical field is widened inside the junction before it enters the output waveguides.

In a further embodiment, the present invention relates to making a semiconductor device wherein the output waveguides have a prolonged parallel waveguide section that enables more optical field to be collected by the two output waveguides.

In a even further embodiment, the present invention relates to making a semiconductor device wherein the output waveguides have a prolonged parallel waveguide section that enables more optical field to be collected by the two output waveguides.

In a even further embodiment, the present invention relates to making a semiconductor device, in which the device is a Laser, a Optical Amplifier, an Electron Absorption Modulator, a Junction Optical Modulator, an Arrayed Waveguide Grating or other device with wet etched optical waveguides with junctions.

In another embodiment, the present invention relates to making a semiconductor device in which the optical waveguide(s) have an optical coating on the end, consisting of one or more layers.

In an even further embodiment, the present invention relates to making a semiconductor device in which the optical coating have one or more layers of $SiO_x$, $SiN_x$, $SiO_xN_y$, Spin-on glass, $TiO_x$, $AlO_x$, $AlN_x$, CVD-diamond or alike.

In an even further embodiment, the present invention relates to making a semiconductor device in which the optical coating have layers of alternately high and low refractive index, in which the refractive index is between that of air and that of $Al_{1-x-z}Ga_xIn_zAs_{1-y}Sb_y$ with $0<x<1$, $0<y<$, $0\leq z<1$ and $0<x+z\leq 1$, in order to increase or reduce the reflection at the end of the waveguide(s).

In a further embodiment, the present invention relates to making a semiconductor device in which the optical coating have one or more layers of metal on top or in between coating layers, which results in increased reflectivity.

In a further embodiment, the present invention relates to making a semiconductor device in which the optical coating is electrically passivating the semiconductor surface beneath it.

In another embodiment, the present invention relates to making a semiconductor device in which the layer of electrically insulating material is applied on top of the waveguide or parts of it, in order to electrically insulate it from other parts of the device.

In a further embodiment, the present invention relates to making a semiconductor device in which the electrically insulating material is $SiO_x$, $SiN_x$, $SiO_xN_y$, Spin-on glass, $TiO_x$, $AlO_x$, $AlN_x$, CVD-diamond or alike dielectric.

In another embodiment, the present invention relates to making a semiconductor device in which the metal contact layer(s) are partly on top of the electrically insulating material, and is connected to the semiconductor contact layer in parts of the area not covered by the electrically insulating material.

In a further embodiment, the present invention relates to making a semiconductor device in which a the p-type cladding has electrical connection with a p-doped semiconductor contact layer, which is in electrical connection with a metal contact comprising a layer of Titanium, a layer of Platinum and a layer of Gold on top.

In an even further embodiment, the present invention relates to making a semiconductor device in which a the n-type cladding has electrical connection with a n-doped semiconductor contact layer, which is in electrical connection with a metal contact comprising a layer of Palladium, a layer of Platinum and a layer of Gold on top.

In another aspect, the present invention relates to making a semiconductor device in which the material compositions are chosen so that the average refractive index of the core is higher than that of the cladding material.

In an even further embodiment, the present invention relates to making a semiconductor device in which the Aluminium content of the cladding is higher than that of the core.

In another aspect, the present invention relates to making a semiconductor device, in which the semiconductor layers are formed by molecular beam epitaxy.

In one embodiment, the present invention relates to making a semiconductor device in which one cladding layer is n-doped and one cladding layer is p-doped.

In a further embodiment, the present invention relates to making a device in which the p-type dopant is Beryllium and the n-type dopant is Tellurium.

In an even further embodiment, the present invention relates to making a device wherein the composition of the semiconductor layers are chosen so that the lattice constants of the cladding, barrier and core layers are matched to that of the substrate.

In an even further embodiment, the present invention relates to making a device wherein the composition of the quantum well layers are chosen so that the lattice constants differ to that of the substrate.

In an even further embodiment, the present invention relates to making a device wherein the quantum well layers have compressive strain.

In an even further embodiment, the present invention relates to making a device wherein the composition of the layers are as follows:

Cladding layers $Al_{0.90-x}Ga_{0.10}In_xAs_{0.06}Sb_{0.94}$ with $0\leq x<0.2$ and $0<y<0.5$ Core layers $Al_{0.25}Ga_{0.75}As_{0.03}Sb_{0.97}$ Quantum well layers $Ga_{1-x}In_xAs_ySb_{1-y}$ with $0.1<x<0.5$ and $0<y<0.5$ Barrier layers $Al_xGa_{1-2x}In_xAs_ySb_{1-y}$ with $0.09<x<0.5$ and $0<y<0.5$ In an even further embodiment, the present invention relates to making a device in which the thickness of the layers are as follows:

Cladding layers 1900 nm
Core layers 115 nm (around quantum wells)
Quantum well layers 10 nm
Barrier layers 20 nm In an even further embodiment, the present invention relates to making a device in which metal and/or semiconductor contact layers in are in contact with the cladding layers to inject electrical current into the device.

In an even further embodiment, the present invention relates to making a device in which the p-type cladding has contact with a 100 nm Be-doped GaSb semiconductor contact layer, which is in contact with a metal contact comprising a layer of 500 nm Titanium, a layer of 500 nm Platinum and a layer of 2000 nm Gold on top.

In an even further embodiment, the present invention relates to making a device in which the n-type cladding has contact with a 50-100 μm Te-doped GaSb semiconductor contact layer, which is in contact with a metal contact comprising a layer of 500 nm Palladium, a layer of 500 nm Platinum and a layer of 2000 nm Gold on top.

In an even further embodiment, the present invention relates to making a device wherein the interfaces between the cladding layer and the semiconductor contact layer is graded to reduce conduction and valence band bending.

In an even further embodiment, the present invention relates to making a device in which injected electrical current is producing light emission from the active layer.

In an even further embodiment, the present invention relates to making a device in which the semiconductor body comprise or is disposed within an optical cavity.

In an even further embodiment, the present invention relates to making a device in which an optical cavity is made by wet etching one or more ridges and/or junction into one of the cladding layers.

In an even farther embodiment, the present invention relates to making a device in which the ridge has a width of 1-250 μm In an even further embodiment, the present invention relates to making a device in which all or part of the ridge sides and top is covered by spin-on glass.

In an even further embodiment, the present invention relates to making a device in which all or parts of the ridge top and/or the spin-on-glass is covered by the metal contact layer.

In an even further embodiment, the present invention relates to making a device in which the device is a laser that produces laser emission.

In an even further embodiment, the present invention relates to making a device in which the device is a semiconductor optical amplifier with low-reflection coatings at the ridge waveguide ends, that amplifies optical light passing through the ridge.

In another embodiment, the present invention relates to making a device in which the active region is optically pumped.

In a further embodiment, the present invention relates to making a device in which the semiconductor body comprise or is disposed within an optical cavity.

In an even further embodiment, the present invention relates to making a device in which an optical cavity is made by wet etching a ridge into one of the cladding layers.

In an even farther embodiment, the present invention relates to making a device in which the device is a laser that produces laser emission.

In another embodiment, the present invention relates to making a device in which the active region is optically pumped.

In another embodiment, the present invention relates to making a device in which the active region emits light in the region 1.0-5.0 microns.

In another aspect, the present invention relates to making a device in which light in the region 1.0-5.0 microns is guided in the device.

In one embodiment, the present invention relates to making a device wherein the optical waveguide is a ridge optical waveguide with graded slopes on the ridge sides with Single Mode behaviour.

In another aspect the present invention relates to making a semiconductor device in which an epitaxial technique as Molecular Beam Epitaxy or alike is used to form the layers.

BRIEF DESCRIPTION OF THE FIGURES

FIG. 1 shows Scanning Electron Microscopy picture of a thin photoresist masking layer on top of a semiconductor ridge waveguide. Some etching beneath the masking layer can be seen at the edges.

FIG. 2 shows optical Nomarski microscope picture of a wet etched Ψ-Junction ridge (500×). The dark area shows were the cladding has been etched away, revealing the U-shaped feature of the inner part of the junction.

FIG. 3 shows schematics of Y- and Ψ-Junction designs and the difference of such. The Ψ-Junction has opposite bending ($R_2$) and prolonged waveguides in junction area to reduce loss from the U-shaped feature that results from isotropic etching.

FIG. 4 shows refractive index profile and of simulated structure. Wafer surface is at Y=2.3 um, waveguide core from Y=0 to Y=0.4 um (Vertical direction).

FIG. 5 shows plot of electrical field in simulated splitting of optical beam by symmetric Ψ-Junction ridge. Gaussian optical beam enters at X=Z=0 um and is propagated into the U-juction and further into two arms (after Z=600 um), one S-bending waveguide and one straight waveguide.

FIG. 6 shows index cross-section of ridge profile from model of wet-etch ridge. Bottom of the ridge is 6 μm wide, while the top is 5 μm due to the under etch feature during wet etching.

FIG. 7 shows transverse fundamental mode of the wet-etch type ridge in FIG. 6 (5 μm top). The figure shows that this ridge profile exhibits little field loss (although it can support several transverse modes).

FIG. 8 shows transverse mode profile (m=1) of wet-etch type ridge as shown in FIG. 6, but with 3.5 μm wide ridge top. Beam propagation shows that this structure can only support a second mode in addition to the first transverse mode (m=0).

FIG. 9 shows transverse mode profile (m=0) of wet-etch type ridge as shown in figure xx, but with 3.3 μm wide ridge top. Beam propagation shows that such structures with 3.2 μm-3.4 μm wide ridge tops cannot support a second mode, meaning single mode propagation.

FIG. 10 shows optical microscopy picture of a n-Junction laser structure. The picture shows the metal contacts with pads (yellow), waveguides (black) and spin-on glass (orange). The waveguides were etched prior to applying spin-on glass dielectric and metal contacts on top.

FIG. 11 shows etch rates of $Al_{0.90}Ga_{0.10}AsSb$ and $Al_{0.82}Ga_{0.10}In_{0.08}AsSb$ which suggests increased etch uniformity from a lactic acid based etchant when adding In to $Al_{0.90}Ga_{0.10}AsSb$ (lattice matched to GaSb).

FIG. 12 shows modal gain of an Ψ-Junction laser (as in FIG. 10) with ~150 μm difference in arm length. The device shows a tuneablility of 4 nm around the 2330 nm central wavelength.

FIG. 13 shows modal gain of an Ψ-Junction laser with only ~5 μm difference in arm length. The device shows a potential tuneablility of over 100 nm around the 2330 nm central wavelength for such a device.

FIG. 14 shows maximum waveguide ridge width for Single Mode behaviour, as a function of core thickness, in an AlGaInAsSb ridge. The width was calculated using the effective index method with cladding above the core (the ridge) and no cladding at the sides of the ridge (RI=1.4). Refractive index of core was 3.62 and 3.30 for ridge and cladding.

FIG. 15 shows photoluminescence spectra at RT from $Ga_{0.83}In_{0.17}As_ySb_{1-y}$ quantum wells with $Al_{0.21}In_{0.15}Ga_{0.64}As_ySb_{1-y}$ or $Al_{0.21}In_{0.15}Ga_{0.64}As_ySb_{1-y}$ barriers, nearly lattice matched to GaSb. Growth fluxes were kept at 0.75 ML/s for Ga, 0.25 ML/s for Al and 0.15 ML/s In for both samples. Using In in the barrier can be seen to increase the wavelength.

FIG. 16 shows a [004] x-ray diffraction spectrum from a sample with $Ga_{0.72}In_{0.28}As_ySb_{1-y}$ quantum wells and $Al_{0.22}Ga_{0.56}In_{0.22}As_ySb_{1-y}$ barriers, lattice matched to GaSb at room temperature. The spectrum shows a superlattice period of 27 nm.

FIG. 17 shows a ψ-Junction ridge laser structure after spin etching. The thin ~4 μm wide ridge waveguide can be seen inside larger contact/support areas which are electrically isolated.

FIG. 18 shows an emission spectrum from a $Al_{0.22}In_{0.22}Ga_{0.55}AsSb/In_{0.29}Ga_{0.71}AsSb$ MQW wet etched junction ridge laser (p-side down). For a current of 16 mA with 10% duty cycle pulses (160 mA current in pulse), the laser is around threshold. At 20 mA and 25 mA, three of four modes can be seen to lase, while at 120 mA with 60% duty cycle pulses only one strong mode at 2375 nm can be seen.

DETAILED DESCRIPTION OF THE INVENTION

The present invention is described with basis in the following, non-limiting examples. The patent is intended to cover all possible variations and adjustments, which may be made, based on the appended claims.

EXAMPLES

A new tunable mid-IR semiconductor laser uses AlGaIn-AsSb material as cladding, AlInGaAsSb or AlGaAsSb material for spacers (core, around active region) and AlInGaAsSb or AlGaAsSb barriers and AlInGaAsSb or InGaAsSb wells in the multiple quantum well active region. The bottom cladding was grown on an Te-doped (n-type) GaSb substrate, while a thin p-type GaSb contact/cap layer was grown on top of the top cladding. For the test lasers we found that an $Al_{0.86}Ga_{0.10}In_{0.04}As_{0.06}Sb_{0.94}$ cladding that gave the best etching uniformity across the sample, so that ridges could be etched out of the top cladding and contact layer with accurate depth. An $Al_{0.90}Ga_{0.10}As_{0.06}Sb_{0.94}$ cladding was also tested and gave reasonable results as well. The etched ridges enabled the laser to be made single mode with a top ridge width of around 3.5 μm. For the core material, $A_{0.25/(0.90+x)}Ga_{0.65/(0.90+x)}In_{x/(0.90+x)}AS_ySb_{1-y}$ was used in the spacers and barriers while $Ga_{0.65/(0.65+x)}In_{x/(0.65+x)}As_ySb_{1-y}$ was used in the well. The group V material composition in the well was chosen so that the wavelength emission of the laser, was ~2.10 μm at x=17%, ~2.33 μm at x=28% and ~2.338 μm at x=29%. This enable the structure to be grown by MBE without changing the In-flux during the growth of the core.

In order to make tuneable lasers, a new laser type, called Ψ-Junction laser was designed so that wet etching could be used for the junction structure in the device. FIG. 2 shows such a Ψ-Junction after wet etch, showing the typical U-feature of the inner part of the junction. FIG. 3. shows the difference between a traditional junction design and the new U-type junction. FIG. 4. and 6. shows vertical profile and contour map of refractive index through simulated structure. The sloped contour profile in FIG. 6. is due to the wet etching which gives a sloped ridge structure due to under etching of the photoresist. FIG. 7 and 8 shows that the ridge in FIG. 6. (5 μm wide at top) has more than one mode. This is favourable in terms of single mode guiding, as the simulated ridge became single mode for widths of 3.2-3.4 μm. This is much wider than what the effective index method gives for a square ridge waveguide (without the side slope). FIG. 14 shows that a traditional ridge with RI=3.30 in cladding and RI=3.62 in core (0.4 μm thick), would have to be 1.38 μm wide or smaller to be Single Mode. It is thus an improvement to use graded slope cladding as it enables wider Single Mode ridges to be made and therefore higher injection current than for square ridge structures.

FIGS. 5 (*a* and *b*) shows the optical field from the beam propagation simulation of the Ψ-Junction used here. In FIG. 5, the optical field enters at Z=X=0 and is propagated to Z=2000 μm, at which most of the optical field has been divided into two waveguides. This shows that the Ψ-Junction can be used as an optical splitter in the laser.

The new Ψ-Junction was incorporated with the laser structure to obtain two optical paths with different lengths. This enabled longitudinal mode suppression so that longitudinal single mode operation of the device could be achieved. By applying ohmic Ti/Pt/Au metal contacts to the GaSb contact layer on top of the ridge, electron injection could be achieved. For the hole injection, a Pd/Pt/Au metal contact was connected to the n-type GaSb substrate. Optical emission was then obtained through electrical injection into the active layer beneath the ridge. Thus, optical gain was achieved in the waveguides so that stimulated emission could be achieved. By cleaving the edges of the device, reflection was achieved at the ends of the two optical cavities. This enabled lasing through the stimulated emission in the two waveguides. The metal contacts were connected to metal pads through metal connections on top of an electrically insulating layer of spin-on glass. Four different contact pads for connecting the device to a power supply was connected to different top ridge parts of the device as shown in FIG. 10. This enabled the device to be tuned to different wavelengths by changing the injection current into the different parts. The difference in length between the two waveguide-arms in the laser, determine the tuneablility of the laser. For an arm length difference of ~150 um (as in the device in FIG. 10), the wavelength can be tuned within ~4 nm without mode hop (see FIG. 12), while a length difference of only ~5 nm gives over 100 nm between the interferomteric modes as shown if FIG. 13. In both devices, the wavelength is tuned by changing the injection current in the laser and/or by changing the temperature of the device.

A laser structure was grown with MBE onto a Te-doped GaSb wafer, consisting of 2 μm $Al_{0.9}Ga_{0.10}As_{0.04}Sb_{0.96}$ cladding, 150 nm $Al_{0.28}Ga_{0.72}AsSb$, AlAsSb and/or $Al_{0.22}In_{0.22}Ga_{0.55}AsSb$ core and three 20 nm $Al_{0.22}In_{0.22}Ga_{0.55}AsSb$+8 nm $In_{0.29}Ga_{0.71}AsSb$ quantum wells. The lower cladding closest to the Te-doped wafer was doped using a GaTe doping source, while the upper cladding was doped with a Be doping source. On top of the cladding we applied a capping of Be-doped GaSb. After growth, photoresist was applied to the wafer with openings for the waveguides. The wafer was then metallized with 50 nm Ti, 50 nm Pt and 200 nm Au using e-beam metallization. Photoresist was then removed with acetone for lift-off definition of the waveguide contacts. After liftoff a new photoresist layer was applied on top of the waveguide contacts and exposed to define adjacent areas of dielectric. 100 nm of dielectric $SiO_2$, 50 nm of Cr metal and 150 nm of Au metal was then deposited using e-beam and photoresist removed for lift-off. The result was waveguide contacts with a 10 μm open area and dielectric areas around this again. For ridge definition, the laser was then etched in a spin etch configuration using the metal and dielectric as a self-aligned mask. The etchant consisted of 100 ml 2.5M Lactic Acid, 5 ml 48% HF and 20 ml 33% $H_2O_2$, and was applied onto the wafer for 2.7 seconds at 200 rpm to etch 1.9 μm into the cap and cladding.

FIG. 17 shows the spectral output of such a $Al_{0.22}In_{0.22}Ga_{0.55}AsSb/In_{0.29}Ga_{0.71}AsSb$ MQW laser with $Al_{0.28}Ga_{0.72}AsSb$ core.

REFERENCES

1. Bugge R. and Fimland B. O.: "A new etch", Patent no. NO20026261
2. Choi H. K. and Eglash S.: "High-efficiency high power GaInAsSb-AlGaAsSb Double-Heterostructure Lasers Emitting at 2.3 microns", pp. 1555-9, *IEEE Journal of Quantum Electronics*, Vol. 27, No. 6 (1991)
3. Simanowski S., Mermelstein C., Walthers M., Herres N., Kiefer R., Rattunde M., Schmitz J., Wagner J. and Weimain G.: "Growth and layer structure of 2.26 μm (AlGaIn) (AsSb) diode lasers for room temperature operation", pp. 595-9, *Journal of Crystal Growth*, Vol. 227-228 (2001)
4. Yarekham D. A., Vicet A., Perona A., Glastre G., Fraisse B., Rouillard Y., Skouri E. M., Boissier G., Grech P., Joullie A., Alibert C. and Baranov A. N.: "High efficiency GaInSbAs/GaSb type-II quantum well continuous wave lasers", pp. 390-4, *Semiconductor Science and Technology*, Vol. 15 (2000)
5. Sewell P., Benson T. M., Anada T., Kendall P. C.: "Bi-oblique propagation analysis of symmetric and asymmetric Y-junctions", pp. 688-96, *Journal of Lightwave Technology*, Vol. 15, Iss. 4 (1997)
6. Al Hemyari K., Doughty G. F., Wilkinson C. D. W., Kean A. H., Stanley C. R.: "Optical loss measurements on GaAs/GaAlAs single-mode waveguide Y-junctions and waveguide bends", pp. 272-6, *Journal of Lightwave Technology*, Vol. 11, Iss. 2 (1993)
7. R. Bugge: "A new process for Te-doped materials and structures", patent NO. 20045305 (2004)

The invention claimed is:

1. A semiconductor device comprising:
   at least three layers of semiconductor material disposed on a substrate material, the semiconductor material having a formula $Al_{1-x-z}Ga_xIn_zAs_{1-y}Sb_y$ with $0<x<1$, $0<y<1$, $0<z\leq1$ and $0<x+z<1$, with at least one layer where $0<z<1$ and $0<x+z<1$, wherein at least some of the semiconductor layers comprise two cladding layers around a core of one or more layers, said cladding layers consisting essentially of $Al_{1-x-z}Ga_xIn_zAs_{1-y}Sb_y$ with $0<x<0.6$, $0<y<1$, $0\leq z<0.5$ and $0<x+z<0.6$,
   the device further comprising:
   a) an etched structure in the semiconductor material for defining an optical waveguide and/or electrical connection through the device;
   b) an electrical insulating layer or parts for insulating parts of the device and/or to define contacts and/or conduction wires in or on the device; and
   c) a metal layer or parts for defining contacts and/or conduction wires in or on the device.

2. A semiconductor device according to claim 1, wherein one cladding layer is n-doped and one cladding layer is p-doped.

3. A semiconductor device according to claim 2, wherein the cladding layers have a formula $Al_{0.90-x}Ga_{0.10}In_xAs_{0.06}Sb_{0.94}$ with $0\leq x<0.2$ and $0<y<0.5$; the core layers have a formula $Al_{0.25}Ga_{0.75}As_{0.03}Sb_{0.97}$; quantum well layers are present having a formula $Ga_{1-x}In_xAs_ySb_{1-y}$ with $0.1<x<0.5$ and $0<y<0.5$; and barrier layers are present having a formula $Al_xGa_{1-2x}In_xAs_ySb_{1-y}$ with $0.09<x<0.5$ and $0<y<0.5$.

4. A semiconductor device according to claim 3, wherein the optical waveguide is a wet etched ridge waveguide junction in the material comprising at least one input waveguide extending into at least two output waveguides, such that an optical wave is guided from the input waveguide and divided into the output waveguides, and/or vice versa.

5. A semiconductor device according to claim 4, wherein a groove or space between the two output optical waveguides is designed so that it has an U-like groove end at a point where the optical input waveguide ends and the output waveguides start.

6. A semiconductor device according to claim 5, wherein there are at least two elements of waveguide design around the input waveguide, with bending from an initial angle to the output waveguides into a parallel section, so that the optical field is widened inside the junction before entering the output waveguides so that more light is collected.

7. A semiconductor device according to claim 2, wherein that the device emits light in a region of 1.0-5.0 microns.

8. A method of forming a semiconductor device comprising least three layers of semiconductor material disposed on a substrate material, the semiconductor material of formula $Al_{1-x-z}Ga_xIn_zAs_{1-y}Sb_y$ with $0<x<1$, $0<y<1$, $0<z<1$ and $0<x+z<1$, and at least one layer with $0<z<1$ and $0<x+z<1$, wherein at least some of the semiconductor layers comprise two cladding layers around a core of one or more layers,
   the method comprising the steps of:
   a) forming an etched structure in the semiconductor material for defining optical waveguides and/or electrical connections through the device;
   b) forming an electrical insulating layer or parts for insulating parts of the device and/or to define contacts and/or conduction wires in or on the device;
   c) forming a metal layer or parts for defining contacts and/or conduction wires in/on the device; and
   d) forming said cladding layers, wherein the cladding layers comprise $Al_{1-x-z}Ga_xIn_zAs_{1-y}Sb_y$ with $0<x<0.6$, $0<y<1$, $0\leq z<0.5$ and $0<x+z<0.6$.

* * * * *